United States Patent
Sud et al.

(10) Patent No.: US 7,005,656 B1
(45) Date of Patent: Feb. 28, 2006

(54) ION IMPLANTER WITH VACUUM-MAINTAINING CIRCUIT BOARD PROVIDING CONNECTIONS TO INTERNAL FARADAY CUPS

(75) Inventors: Rajen Sud, Burlington, MA (US); Michael Fiorito, Newburyport, MA (US); Thomas Schaefer, Groveland, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 11/048,420

(22) Filed: Feb. 1, 2005

(51) Int. Cl.
*H01J 37/04* (2006.01)

(52) U.S. Cl. .......................... 250/492.21; 250/492.21; 250/397

(58) Field of Classification Search .......... 250/429.21, 250/397

See application file for complete search history.

(56) References Cited

U.S. PATENT DOCUMENTS

| | | | |
|---|---|---|---|
| 4,724,324 A | | 2/1988 | Liebert .................. 250/397 |
| 5,103,161 A | * | 4/1992 | Bogaty .................. 324/71.3 |
| 5,198,676 A | * | 3/1993 | Benveniste et al. ......... 250/397 |
| 6,847,036 B1 | * | 1/2005 | Darling et al. ............. 250/291 |
| 2003/0191899 A1 | | 10/2003 | Evans ...................... 711/134 |

* cited by examiner

*Primary Examiner*—John R. Lee
*Assistant Examiner*—Jennifer Yantomo

(57) ABSTRACT

An ion implanter has an elongated evacuated chamber having a distal end along the path of travel of an ion beam. A planar multilayer printed circuit board (PCB) is located at the distal end of the chamber. The PCB has a first portion sealingly covering the distal end of the chamber and a second portion that extends outside the evacuated chamber, for example in the upward direction. An array of Faraday cups are arranged on a proximal surface of the first portion of the PCB within the chamber, and one or more multi-contact connectors (such as D-type connectors) are located on the second portion of the PCB outside the chamber. The individual contacts of the connector(s) are connected to respective Faraday cups by circuit traces of the PCB.

20 Claims, 6 Drawing Sheets

ION IMPLANTER WITH VACUUM-MAINTAINING CIRCUIT BOARD PROVIDING CONNECTIONS TO INTERNAL FARADAY CUPS

BACKGROUND

The present invention relates to the field of ion implanters used in semiconductor manufacturing.

In ion implanters, it is known to employ components to measure the ion beam current. In one known configuration, components called "Faraday cups" are located at the far end of the evacuated chamber in which the ion beam travels. The ion beam strikes each Faraday cup and creates a corresponding current in an external circuit connected to the Faraday cup. This current is measured and converted into a measure of ion beam current. By using multiple Faraday cups in an arrayed fashion, it is possible to obtain a measure of total beam current (by summing the currents generated from each of the cups) and a representation of the spatial distribution of the beam current. This latter aspect can be useful in shaping and steering the beam accurately.

The connections between the Faraday cups and the external current-measuring circuitry must pass from the high-vacuum internal environment of the ion implanter to the outside operating environment, which is typically at atmospheric pressure. Moreover, the connections must be electrically isolated from the metal walls of the implanter, which are typically connected to a high-voltage source. It has been known to employ specialized feedthrough connectors that are suitably gas-tight at high vacuum and that provide the necessary electrical isolation. Such feedthrough connectors typically have a ceramic body or outer shell with an internal conductive element. The ceramic body is mounted in gas-tight fashion in an opening of a wall of the ion implanter. A connection is made between a Faraday cup within the implanter and one end of the feedthrough connector, and another connection is made between the external circuit and the other end of the feedthrough connector. Where an array of Faraday cups is employed, multiple feedthrough connectors and/or a feedthrough connector with multiple conductive elements are used to provide the necessary plurality of connections.

SUMMARY

The specialized feedthrough connectors used to provide connections to Faraday cups within an ion implanter are expensive and relatively large. The cost and space requirements for these connectors has tended to limit the number of connections that are provided for internal Faraday cups, and consequently limited the number of Faraday cups that are utilized in beam-measuring arrays within ion implanters. As a result, the resolution of the measurement of beam current distribution using these arrays is correspondingly limited. It would be desirable to improve ion beam current measurement resolution without requiring the added cost and space that a larger number of conventional feedthrough connectors would require.

In accordance with the present invention, an ion implanter is disclosed that efficiently provides a large number of connections between the outside and the internal vacuum environment. In particular, the connection scheme enables the use of a relatively large array of Faraday cups for obtaining high-resolution beam current measurements.

The disclosed ion implanter has an elongated evacuated chamber having a distal end along the path of travel of an ion beam. A planar multilayer printed circuit board (PCB) is located at the distal end of the chamber. The PCB has a first portion sealingly covering the distal end of the chamber and a second portion that extends outside the evacuated chamber, for example in the upward direction. An array of Faraday cups are arranged on a proximal surface of the first portion of the PCB within the chamber, and one or more multi-contact connectors (such as D-type connectors) are located on the second portion of the PCB outside the chamber. The individual contacts of the connector(s) are connected to respective Faraday cups by circuit traces of the PCB.

Through the use of the multi-layer PCB, a relatively large number of connections can be provided between the individual Faraday cups and the connector(s) to the external circuitry. The PCB requires little space beyond what has previously been required for the array of Faraday cups alone. Thus, this arrangement provides improved connection density and lower cost per connection than prior art connection arrangements. Additionally, the PCB can incorporate large areas of metallization that can enhance heat dissipation, helping to maintain its operating temperature in an acceptable range.

The PCB can be located at the very end of the path of travel of the ion beam, or it can be used in conjunction with additional beam measuring component(s) located more distally. In one embodiment, the PCB is placed before an energy containment monitor (ECM) that also receives portions of the beam. The PCB includes openings interspersed with the Faraday cups to permit passage of these portions of the beam. The ECM and PCB may be mechanically mounted together to form an assembly that is sealingly mounted to an end chamber of the ion implanter. In a disclosed embodiment, this assembly includes electrostatically charged grids for attracting the beam to the assembly, and a slotted cover over the grids to permit passage of the portions of the beam for either the PCB or the ECM.

BRIEF DESCRIPTION OF THE SEVERAL VIEWS OF THE DRAWING

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, with emphasis instead being placed upon illustrating the embodiments, principles and concepts of the invention.

DETAILED DESCRIPTION

Figure 1:
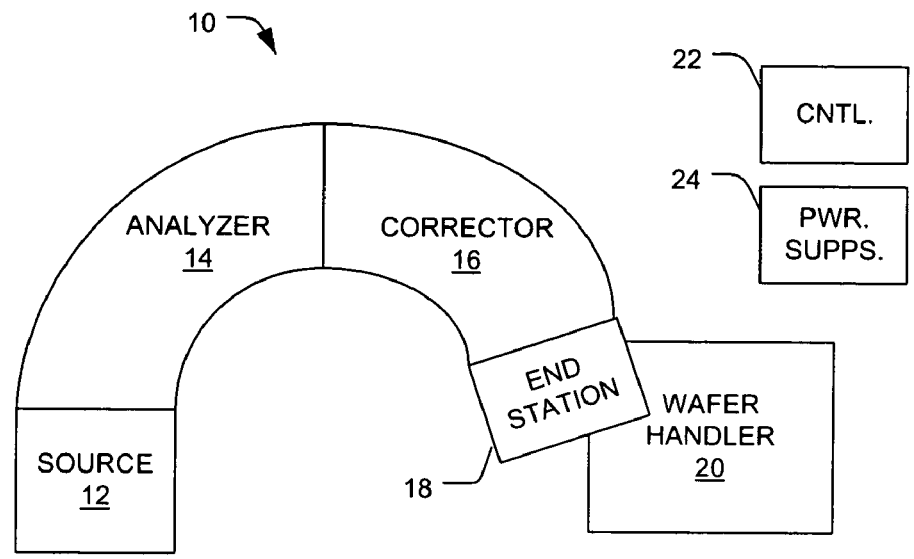
FIG. 1 is a schematic diagram of an ion implanter in accordance with the present invention.

FIG. 1 shows an ion implanter 10 including a source module 12, analyzer module 14, corrector (CORR) module 16, and end station 18. The end station 18 includes a metrology assembly (MA) 19. Immediately adjacent to the end station 18 is a wafer handler 20. Also included are control circuitry (CNTL) 22 and power supplies (PWR SUPPS) 24, which although shown in respective blocks in FIG. 1 are actually distributed throughout the ion implanter 10 as known to those in the art.

During an implantation operation, the source module 12 is fed with a gaseous compound including the element(s) to be implanted into a semiconductor wafer. As an example, for the implantation of boron (B), gaseous boron fluoride (BF3) is supplied to the source module 12. The source module 12 employs electrical excitation to form a plasma that generally includes a number of ion species resulting from fractionation of the source compound, including the desired species (e.g., B+) that is to be implanted. As the source module 12 is biased to a relatively positive potential, the positively charged ion species are extracted from the source module 12 by acceleration out to ground potential, which is negative with respect to the positively biased source module 12. The extracted ion species form the initial part of an ion beam that enters the analyzer module 14.

The analyzer module 14 includes a large, powerful magnet that imparts a bend to the source ion beam portion from the source module 12. The amount of bend varies slightly for the different ion species of the beam, owing to their generally different atomic weights. Thus, as the beam travels toward the corrector module 16 through the analyzer module 14, it spreads out due to the different trajectories of the different ion species. At the exit end, the analyzer module 14 has a resolving slit or opening (not shown in FIG. 1) through which only the species of interest (e.g., B+) passes, while the other species are collected by a conductive plate surrounding the resolving opening. Thus, at the exit of the analyzer module 14, the ion beam consists almost exclusively of the desired ion species.

The corrector module 16 is used to shape and decelerate the beam, bringing the energy level of the ions to a desired energy level for proper implantation. In one embodiment, the end station 18 includes mechanical wafer scanning apparatus (not shown) that scans a wafer across the beam (which is stationary) to effect the implantation. As described in greater detail below, the metrology assembly 19 resides at the end of the beam path and includes apparatus for measuring the angle of the ion beam. The wafer handler 20 is a clean, robotic mechanical system for transferring wafers between a human operator of the system and the scanning apparatus.

In the following description, the terms "proximal" and "distal" are used to indicate location of items with respect to the source module 12 along the path of the beam. Thus, the metrology assembly 19, for example, is located at a distal end of the end station 18, and the correction module 16 is more proximal to the source module 12 than the end station 18.

Figure 2:
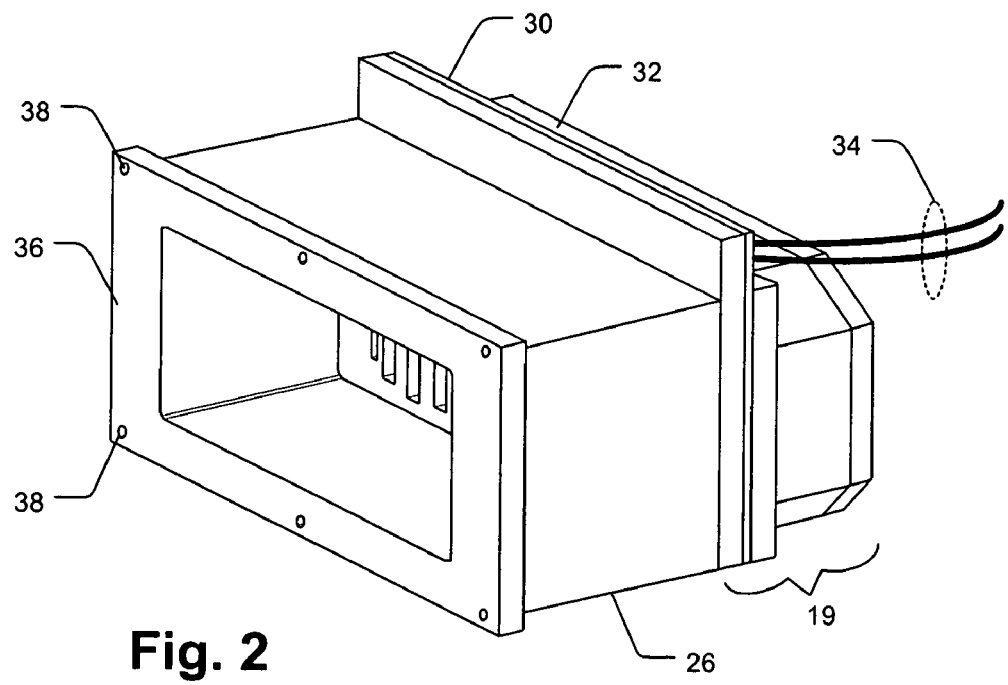
FIG. 2 is a perspective view of a metrology assembly forming part of an end station in the ion implanter of FIG. 1.

FIG. 2 shows the metrology assembly 19, which is bolted to a Faraday chamber 26 in the end station 18 of the ion implanter 10. The metrology assembly 19 includes a beam angle circuit board 30 and an energy containment monitor (ECM) assembly 32. Cables 34 are connected to the beam angle circuit board 30 to carry electrical signals to separate measurement and monitoring circuitry not shown in the Figures. The Faraday chamber 26 has a flange 36 with bolt holes 38 for mounting to a mating mechanical structure (not shown) of the end station 18.

Figure 3:
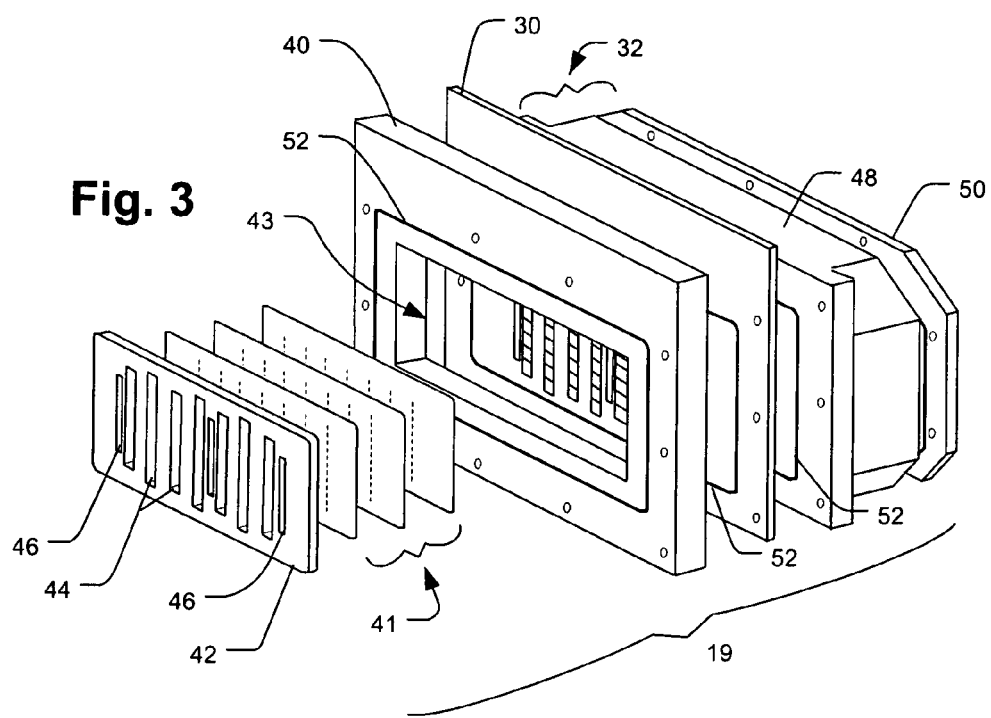
FIG. 3 is an exploded perspective view of the metrology assembly of FIG. 2.

FIG. 3 is an exploded view of the metrology assembly 19. The beam angle circuit board 30 is mounted between the ECM assembly 32 and a rigid metallic frame 40. Also mounted to the frame 40 are a plurality of electrode grids 41, which serve to direct the ion beam toward the circuit board 30 and the ECM assembly 32, and a slotted cover 42 that extends across a central opening 43 of the frame 40. The cover 42 includes seven major slot openings 44 and three minor slot openings 46 that all permit respective portions of the ion beam to pass through the cover 42 to reach either the beam angle circuit board 30 or the ECM assembly 32, as described in more detail below. The ECM assembly 32 includes an ECM body 48 and an ECM cover 50. Gaskets 52 are disposed among the various components to form respective gas-tight seals. Such seals are necessitated by the high vacuum maintained within the chamber of the ion implanter 10 along the path of travel of the ion beam.

As is apparent in FIGS. 2 and 3, the beam angle circuit board 30 and frame 40 extend in an upward direction beyond the top boundary or envelope of the ECM assembly 32, which forms the enclosure for the end of the ion beam path. As described in more detail below, a first portion of the circuit board 30 that resides within this envelope includes components for collecting the beam current for measurement purposes, and sealingly covers the distal side of the frame 40. A second portion of the circuit board that is outside this envelope includes relatively high-density multi-pin connectors to which external test and measurement equipment can be connected. The frame 40 has corresponding first and second portions that are substantially co-extensive with the first and second respective portions of the circuit board 30 in the illustrated embodiment. As also described in more detail below, the circuit board 30 includes multiple internal signal layers connecting the beam-collecting components with corresponding contacts of the connectors. By this arrangement, a relatively large number of electrical measurement signals created within the high-vacuum chamber are carried out to the high-density connectors accessible by external test equipment at ambient atmospheric pressure to enable high-precision beam angle measurements to be made.

Figure 4:
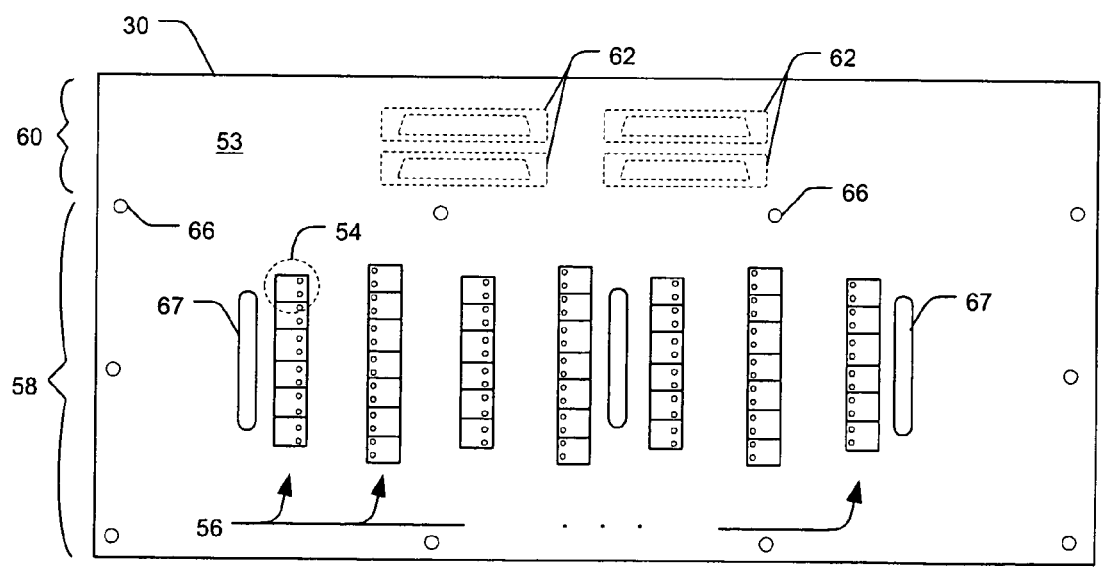
FIG. 4 is a plan view of a beam angle printed circuit board (PCB) in the metrology assembly of FIGS. 2 and 3.

FIG. 4 shows a proximal side or surface 53 of the beam angle circuit board 30, which is the side upon which the ion beam impinges during operation of the ion implanter 10. An array of Faraday cups 54 are arranged into varying-size columns 56 (i.e., alternate columns have 6 and 7 Faraday cups 54 as shown). The Faraday cups 54 are located on a first portion 58 of the circuit board 30 that lies within the enclosure for the ion beam path as defined by the Faraday chamber 26 and the ECM assembly 32. More specifically, each column 56 is aligned with a corresponding major opening 44 of the cover 42 (FIG. 3) so as to receive a corresponding portion of the ion beam during operation. As mentioned above, the circuit board 30 also has a second area 60 that resides outside of this enclosure (specifically, in the illustrated embodiment, above the enclosure). Shown in phantom on the second portion 60 are 62-pin D connectors 62 that lie on the distal side of the circuit board 30, as described in more detail below. Bolt openings 66 accept bolts (not shown) for securing the components of the metrology assembly 19 (including the circuit board 30) to the Faraday chamber 26. Also shown in FIG. 4 are three slot openings 67 that are aligned with the minor openings 46 of the cover 42 (FIG. 3) to permit the passage of corresponding portions of the ion beam to the ECM assembly 32 during operation.

Figure 5:
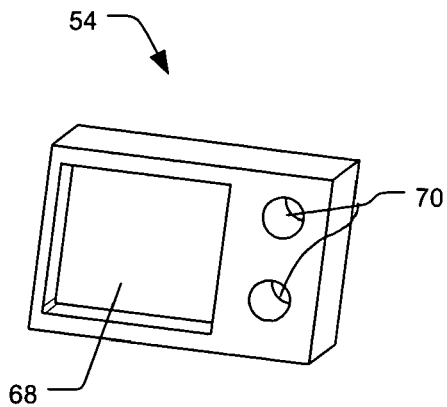
FIGS. 5 and 6 are perspective views of a Faraday cup on the beam angle PCB of FIG. 4.
Figure 6:
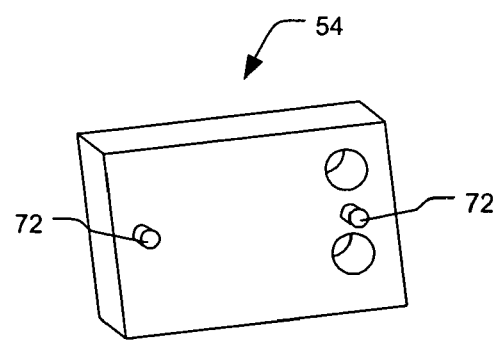

FIGS. 5 and 6 show front and rear views respectively of a Faraday cup 54. As shown, the Faraday cup 54 has a hexahedron shape with a square depression 68 in the front for receiving a portion of the ion beam. Two through-holes 70 accept bolts for securing the Faraday cup 54 to the circuit board 30 (FIG. 4). Two small posts 72 extending from the rear are used for alignment purposes, mating with corresponding alignment holes in the front surface of the circuit board 30 (not visible in the Figures).

Figure 7:
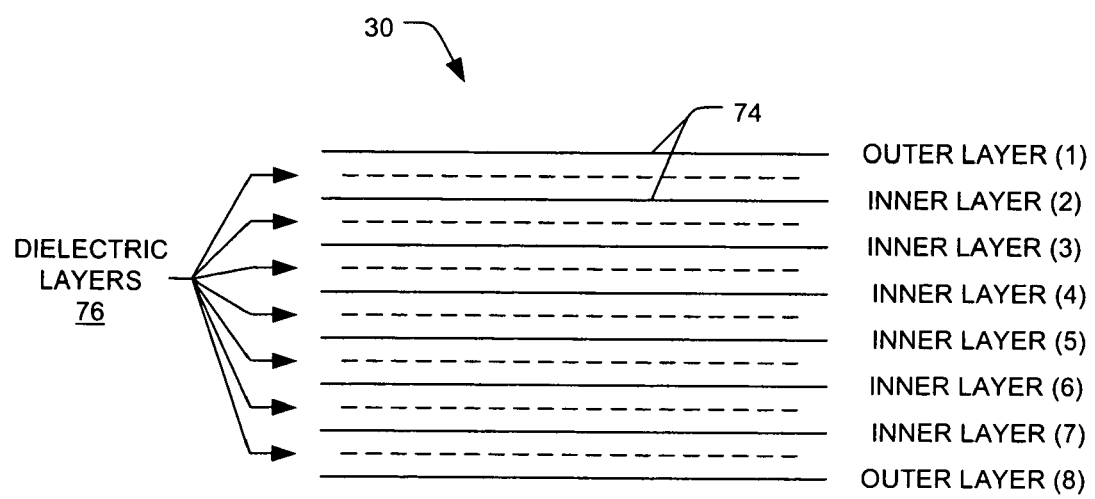
FIG. 7 is a schematic depiction of the layers of the PCB of FIG. 4.

FIG. 7 illustrates the composition of the circuit board 30. The circuit board 30 has 8 conductive layers 74, labeled Layer 1 through Layer 8 in FIG. 7. Layers 1 and 8 are "outer" layers (i.e., reside on the outer surfaces of the circuit board 30), and layers 2–7 are "inner" layers. The conductive layers 74 are separated by corresponding dielectric layers 76. In the illustrated embodiment, the conductive traces that extend between the Faraday cups 54 and the connectors 62 are routed on inner layers. As a result, the outer surfaces of the circuit board 30 are free of the bumpiness that characterizes signal layers, and accordingly provide smooth surfaces for vacuum sealing in conjunction with the gaskets 52 (FIG. 3). Signal layers 1 and 8 may be substantially free of circuit metallization, or, alternatively, may include large planar areas of metallization for purposes of improved heat transfer from the circuit board 30 during operation. It is preferable that any such planar areas of metallization not extend to sealing surface areas of the circuit board 30, i.e., areas that adjoin a sealing gasket 52. It will be appreciated that the inner layers 2–7 include layers having individual circuit traces as well as layers with large metallization areas for distributing ground and supply voltages to circuit components and enhancing heat conduction as described below.

Figure 8:
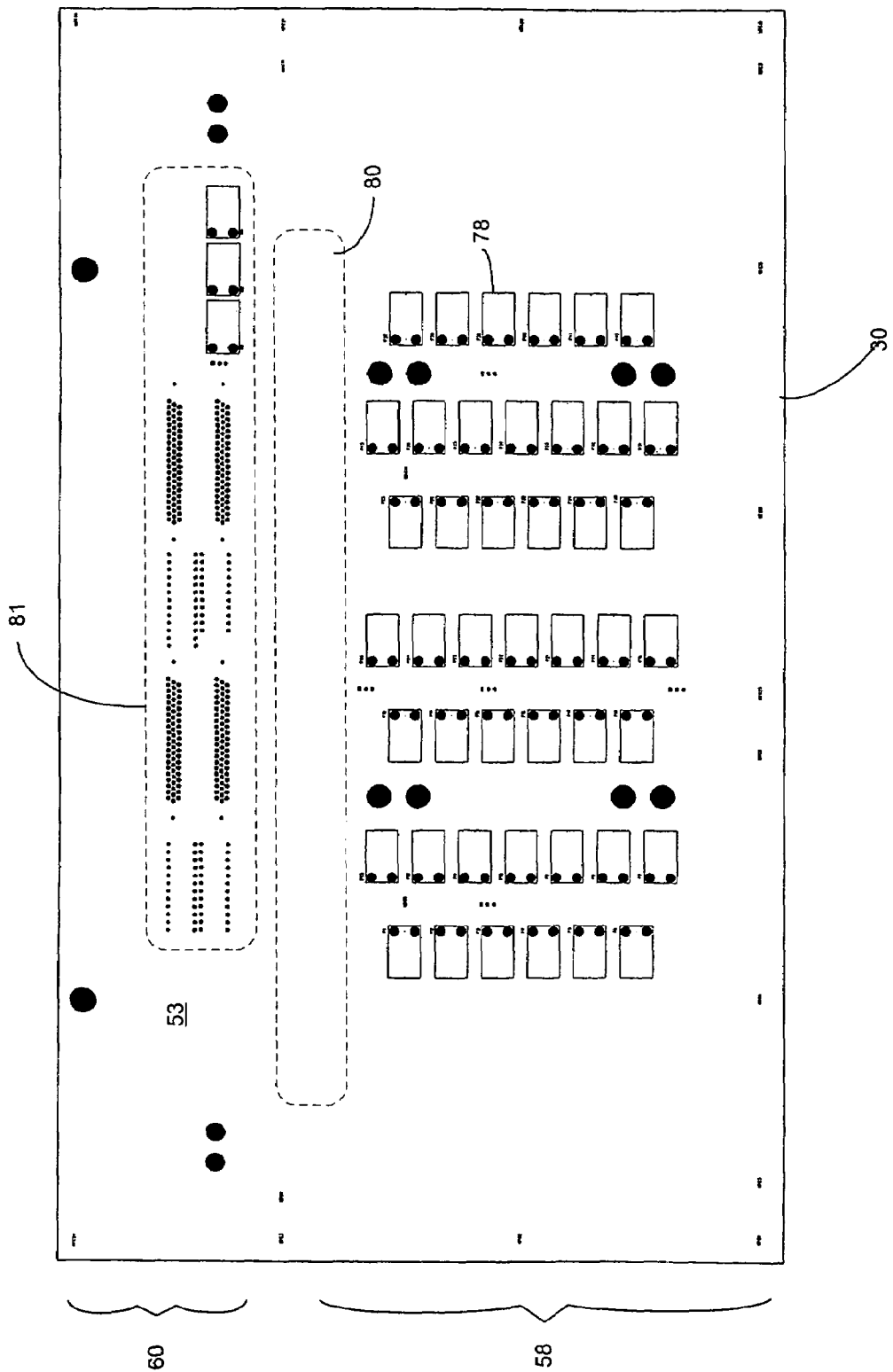
FIG. 8 is a plan view of a first outer conductive layer of the PCB of FIG. 4.

FIG. 8 shows the proximal surface 53 of the circuit board 30 during one stage of manufacture before the addition of any circuit components and the formation of the openings 67. Silkscreened rectangles 78 identify the locations of the Faraday cups 54. As noted above, there are no circuit traces to interfere with the sealing action of the gasket 52 that is located between proximal surface 53 of the circuit board 30 and the frame 40, specifically not in an area 80 between the area 81 of the Faraday cups 54 and the area of the connectors 62.

Figure 9:
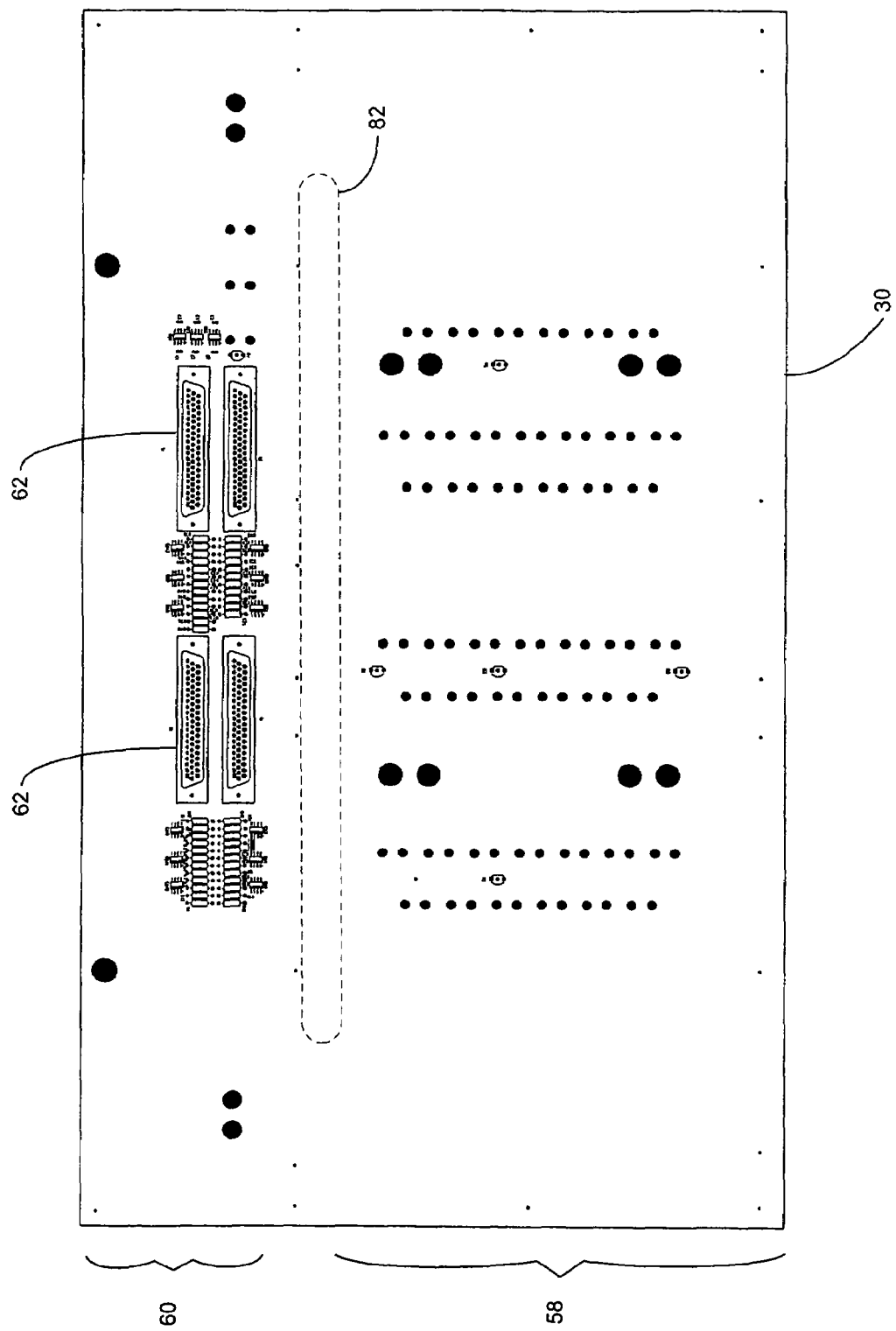
FIG. 9 is a plan view of a second outer conductive layer of the PCB of FIG. 4.

Similarly, FIG. 9 shows the distal surface of the circuit board 30 at a manufacturing stage at which the connectors 62 and other circuit components have been installed. As shown, the connectors 64 are located on the second portion 60 of the circuit board 30 extending beyond the outline of the Faraday chamber 26 and ECM assembly 32, and an area 82 is free of circuit traces that might interfere with a high-vacuum seal between the distal surface of the circuit board 30 and the gasket 52 that is located between the distal surface of the circuit board 30 and the ECM assembly 32.

Figure 10:
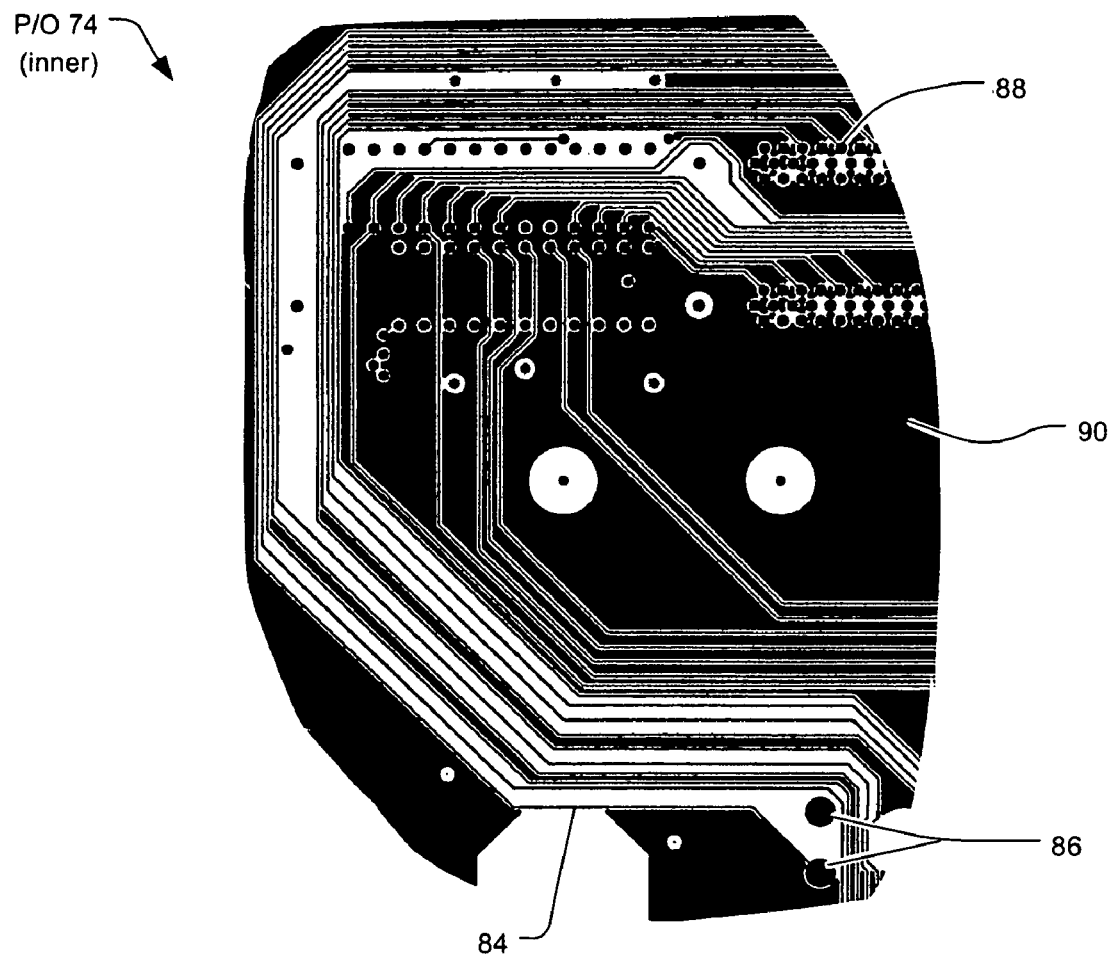
FIG. 10 is a diagram of a portion of an inner conductive layer of the PCB of FIG. 4.

FIG. 10 shows a portion of an inner conductive layer 74 of the circuit board 30. Narrow elongated circuit traces 84 provide connections between pads 86 connected to the Faraday cups 54 and pads 88 connected to pins/receptacles of the connectors 62. The inner layer 74 of FIG. 10 also includes a large area of metallization 90 that can serve to distribute ground or power to circuit components, as well as to provide for enhanced heat transfer from the circuit board 30. For purposes of such enhanced heat transfer, it is preferred that all of the inner signal layers 74 include such large metallization areas, whether also used for ground/power distribution or not.

Those skilled in the art will appreciate that embodiments and variations of the present invention other than those explicitly disclosed herein are possible. It is to be understood that modifications to the methods and apparatus disclosed herein are possible while still achieving the objectives of the invention, and such modifications and variations are within the scope of this invention. Accordingly, the scope of the present invention is not to be limited by the foregoing description of embodiments of the invention, but rather only by the claims appearing below.

What is claimed is:

1. An ion implanter, comprising:
an elongated evacuated chamber having a distal end open along the path of travel of an ion beam; and
a planar multilayer printed circuit board (PCB) at the distal end of the chamber, the PCB having a first portion sealingly covering the open distal end of the chamber and having a second portion extending outside the evacuated chamber, the PCB including (i) a plurality of Faraday cups on a proximal surface of the first portion, each Faraday cup being operative to generate an output current proportional to the ion beam current striking the Faraday cup, and (ii) a multi-contact connector on the second portion of the PCB, contacts of the connector being connected to respective ones of the Faraday cups by respective circuit traces of the PCB and being operative to carry the respective output currents of the Faraday cups to current measuring circuitry outside the evacuated chamber.

2. An ion implanter according to claim 1, wherein the distal end of the chamber comprises a Faraday chamber and a rigid frame attached to a distal end of the Faraday chamber, and wherein the PCB is attached to a distal side of the rigid frame.

3. An ion implanter according to claim 2, wherein the rigid frame has a central opening and a cover disposed over the central opening, the central cover including a plurality of openings through which the ion beam travels during operation of the ion implanter, the openings of the cover being aligned with respect ones of the Faraday cups of the PCB so as to permit the ion beam to reach the Faraday cups.

4. An ion implanter according to claim 3, wherein the cover plate and the PCB are mounted to opposite sides of the rigid frame.

5. An ion implanter according to claim 2, wherein the rigid frame has first and second portions corresponding to the first and second portions respectively of the PCB, the second portion of the rigid frame being co-extensive with the second portion of the PCB to provide rigid support therefor, and wherein the connector is disposed on a distal surface of the second portion of the PCB facing away from the rigid frame.

6. An ion implanter according to claim 5, further comprising an energy containment monitor (ECM) attached to the chamber at a distal surface of the PCB, the ECM being substantially co-extensive with the first portion of the PCB so as to permit access to the connector on the distal surface of the second portion of the PCB.

7. An ion implanter according to claim 1, wherein the Faraday cups are arranged on the PCB in a plurality of parallel columns.

8. An ion implanter according to claim 7, further comprising an energy containment monitor (ECM) attached to the distal end of the chamber, and wherein the PCB includes a plurality of elongated openings interspersed with the columns of Faraday cups to permit passage of corresponding portions of the ion beam to the ECM.

9. An ion implanter according to claim 1, further comprising an energy containment monitor (ECM) attached to the distal end of the chamber, and wherein the PCB includes a plurality of openings to permit passage of corresponding portions of the ion beam to the ECM.

10. An ion implanter according to claim 9, wherein the openings of the PCB comprise elongated slots.

11. An ion implanter according to claim 1, wherein the PCB comprises one or more conductive layers including large areas of metallization effective to dissipate heat from the PCB during operation of the ion implanter.

12. An ion implanter according to claim 1, wherein the first portion of the PCB is sealingly sandwiched between first and second rigid members at the distal end of the chamber.

13. An ion implanter according to claim 12, wherein the first rigid member is a frame member at a proximal side of the PCB and the second rigid member is an energy containment monitor at a distal side of the PCB.

14. An ion implanter according to claim 1, wherein the connector is disposed on a distal surface of the PCB facing away the incident ion beam.

15. An ion implanter according to claim 1, wherein the circuit traces of the PCB are disposed on inner layers of the PCB and the proximal surface of the PCB is smooth and free of circuit traces at least in an area of sealing engagement with the chamber.

16. An ion implanter according to claim 1, wherein the PCB is part of an assembly including a frame and an energy containment monitor between which the PCB is sealingly sandwiched, and wherein the assembly is mounted to a Faraday chamber forming the distal end of the evacuated chamber.

17. An ion implanter, comprising:
   an elongated evacuated chamber having a distal end open along the path of travel of an ion beam, the distal end of the chamber including a Faraday chamber and a rigid frame attached to a distal end of the Faraday chamber;
   a planar multilayer printed circuit board (PCB) at the distal end of the chamber, the PCB having a first portion sealingly attached to the frame and having a second portion extending from the first portion outside the evacuated chamber, the PCB including (i) a plurality of Faraday cups on a proximal surface of the first portion, each Faraday cup being operative to generate an output current proportional to the ion beam current striking the Faraday cup, and (ii) a multi-contact connector on a distal surface of the second portion, contacts of the connector being connected to respective ones of the Faraday cups by respective circuit traces of the PCB and being operative to carry the respective output currents of the Faraday cups to current measuring circuitry outside the evacuated chamber; and
   an energy containment monitor (ECM) sealingly attached to the chamber at the distal surface of the PCB, the ECM being substantially co-extensive with the first portion of the PCB so as to permit access to the connector on the distal surface of the second portion of the PCB.

18. An ion implanter according to claim 17, wherein the rigid frame has a central opening and a cover disposed over the central opening, the central cover including a plurality of openings through which the ion beam travels during operation of the ion implanter, the openings of the cover being aligned with respect ones of the Faraday cups of the PCB so as to permit the ion beam to reach the Faraday cups.

19. An ion implanter according to claim 17, wherein the Faraday cups are arranged on the PCB in a plurality of parallel columns.

20. An ion implanter according to claim 18, wherein the PCB includes a plurality of elongated openings interspersed with the columns of Faraday cups to permit passage of corresponding portions of the ion beam to the ECM.

* * * * *